United States Patent
Jin et al.

(10) Patent No.: US 8,135,148 B2
(45) Date of Patent: Mar. 13, 2012

(54) AUTOMATIC GAIN CONTROL FOR MOBILE MICROPHONE

(75) Inventors: Gary Qu Jin, Kanata (CA); Yonghong Huang, Kanata (CA)

(73) Assignee: Microsemi Semiconductor Corp., Kanata, ON (CA)

( * ) Notice: Subject to any disclaimer, the term of this patent is extended or adjusted under 35 U.S.C. 154(b) by 1356 days.

(21) Appl. No.: 11/740,332

(22) Filed: Apr. 26, 2007

(65) Prior Publication Data

US 2007/0262819 A1    Nov. 15, 2007

Related U.S. Application Data

(60) Provisional application No. 60/745,688, filed on Apr. 26, 2006.

(51) Int. Cl.
*H03G 3/00*    (2006.01)

(52) U.S. Cl. ............................ 381/108; 381/83

(58) Field of Classification Search .......... 381/71.1–14, 381/94.1–9, 102, 104, 107, 56, 57, 66, 83, 381/93, 95, 106, 108; 379/411, 406.01–406.09
See application file for complete search history.

(56) References Cited

U.S. PATENT DOCUMENTS

| | | | |
|---|---|---|---|
| 5,475,632 A * | 12/1995 | Sugiyama | 708/819 |
| 5,557,237 A * | 9/1996 | Carpentier | 330/129 |
| 5,608,804 A * | 3/1997 | Hirano | 381/71.12 |
| 6,147,979 A | 11/2000 | Michel et al. | |
| 7,577,248 B2 * | 8/2009 | McCree | 379/406.08 |
| 2002/0113654 A1 | 8/2002 | Hart | |
| 2003/0123535 A1 * | 7/2003 | Nayak | 375/229 |
| 2004/0242174 A1 * | 12/2004 | Kim et al. | 455/136 |
| 2006/0013383 A1 | 1/2006 | Barron et al. | |
| 2006/0018458 A1 * | 1/2006 | McCree et al. | 379/406.01 |
| 2006/0210096 A1 * | 9/2006 | Stokes et al. | 381/107 |

FOREIGN PATENT DOCUMENTS

| | | |
|---|---|---|
| EP | 0325252 A2 | 7/1989 |
| WO | WO 00/39991 A1 | 7/2000 |

* cited by examiner

*Primary Examiner* — Fan Tsang
*Assistant Examiner* — Eugene Zhao
(74) *Attorney, Agent, or Firm* — Marks & Clerk; Richard J. Mitchell

(57) ABSTRACT

An automatic gain control unit controls the gain applied to an input signal produced by a microphone subject to ambient noise. The automatic gain control circuit continually monitors the signal level of said input signal. A first gain control circuit decreases the gain applied to the input signal in increments of a first size when the input signal exceeds a first predetermined level. A second gain control circuit increases the gain applied to said input signal in increments of a smaller size when the input signal falls below a second predetermined level and in response to the presence of a speech present signal. The second predetermined level is less than said first predetermined level. In one embodiment, the first gain control circuit controls the analog gain of a codec and the second gain control circuit controls the digital gain of the codec.

11 Claims, 3 Drawing Sheets

AUTOMATIC GAIN CONTROL FOR MOBILE MICROPHONE

CROSS REFERENCE TO RELATED APPLICATION

This application claims the benefit under 35 USC 119(e) of prior U.S. Provisional Application No. 60/745,688 filed Apr. 26, 2006.

FIELD OF INVENTION

This invention relates to microphones, and in particular to a method of controlling microphone gain suitable for use in microphones for mobile telephones.

BACKGROUND OF THE INVENTION

In communication systems an echo is the phenomenon wherein a delayed and distorted version of an original signal is reflected back to the source. In a telephone system, the echo causes impairment on the fidelity of the speech signals and is often detrimental to the users. For this reason, telephone systems are often provided with an echo canceller, which attempts to eliminate the echo. In order to do this, the echo canceller produces an echo replica based on an estimate of the signal path of the echo and subtracts it from the input signal. In FIG. 1, a received signal r(n) serves as the reference signal. This signal is emitted by the loudspeaker and picked up by the microphone as an echo signal along with the wanted signal. The echo generator produces an estimate of this signal e(n), which is subtracted from the input signal Sin(n) to produce an output signal Sout(n), which is the input signal with most of the echo component removed.

In a mobile telephone system, both background noise and the return echo are often high due to the mobile environment and high speaker volume, especially in a car. Because of this, the microphone is easily saturated, especially when the driver opens his window while driving on the highway. This creates so called "wind noise" scenario.

If the microphone becomes saturated for whatever reasons, the speech will be distorted, and it will no longer be possible to cancel the echo. The function of AGC (automatic gain control) is to reduce the microphone signal level if saturation occurs and increase the signal level when the condition that caused the saturation improves, such as the mobile phone being moved to another quiet room or the driver closing the window.

A critical issue with AGC control is that the gain variation should not be changed continuously, because of two constraints: Continuous signal level change may cause speech volume variation and the far-end listener to feels very uncomfortable. Continuous gain change on the microphone path will simulate path change to the acoustic echo canceller. The echo canceller does not work well if the echo path keeps changing.

SUMMARY OF THE INVENTION

The present invention relates to an automatic gain control scheme for a microphone signal that allows the gain to be adjusted without affecting echo cancellation and speech quality.

Embodiments of the invention permit the automatic control of microphone gain so that when background noise is too high, the microphone can reduce its gain to prevent saturation. The well known "wind noise" can be controlled. The microphone gain recover is a slow process. To maintain speech quality and echo cancellation performance, a gain dead-zone is introduced so that the microphone is relatively stable when the external environment keeps stable. An embodiment of the invention maximizes signal dynamic range by combining control of both ADC analog gain and digital gain.

According to the present invention there is provided an automatic gain control unit for controlling the gain applied to an input signal produced by a microphone subject to ambient noise, the automatic gain control circuit continually monitoring the signal level of said input signal, and comprising a first gain control circuit for decreasing the gain applied to said input signal in increments of a first size when said input signal exceeds a first predetermined level; and a second gain control circuit for increasing the gain applied to said input signal in increments of a second size when said input signal falls below a second predetermined level and in response to the presence of a speech present signal, said second predetermined level being less than said first predetermined level; and wherein said second size is less than said first size. In one embodiment, the monitoring is triggered by a counter reaching a predetermined threshold. It will be understood that the word continually in this context is not meant to imply that the gain control is continuous, and includes monitoring that occurs repetitively at intervals.

In a preferred embodiment, the first gain control circuit generates a signal for controlling the analog gain applied to the input signal, and the second circuit generates a signal for controlling the digital gain of a codec receiving said input signal. The digital gain of a codec can be changed in smaller increments than the analog gain, for which the minimum step is typically 6 dB.

Another aspect of the invention provides a microphone system for use in a mobile telephone, comprising a first automatic gain control unit for controlling the gain of a signal produced by the microphone, wherein the gain is decreased in steps of a first size when the signal level exceeds a first predetermined level and increased in steps of a smaller size when the signal level falls below a second predetermined level and speech is present, said second predetermined level being less than said first predetermined level; an echo canceller and noise reduction circuitry for canceling echo and reducing noise in the signal output by the first automatic gain control unit; and an inverse gain control unit for canceling out the gain applied by said first automatic gain control unit after echo cancellation and noise reduction.

BRIEF DESCRIPTION OF THE DRAWINGS

The invention will now be described in more detail, by way of example only, with reference to the accompanying drawings, in which:—

DETAILED DESCRIPTION OF THE PREFERRED EMBODIMENTS

Figure 1:
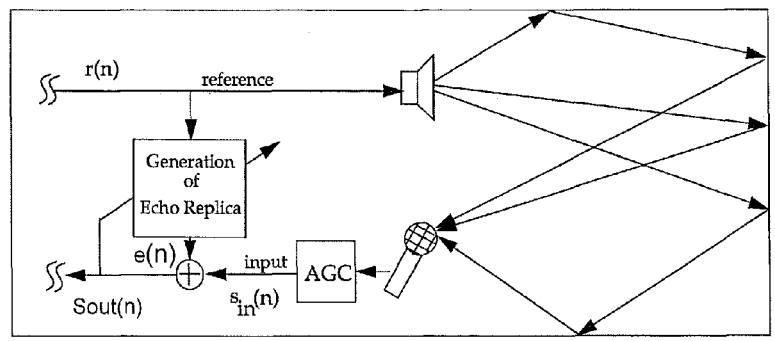
FIG. 1 is a block diagram of a prior art echo canceler.
Figure 2:
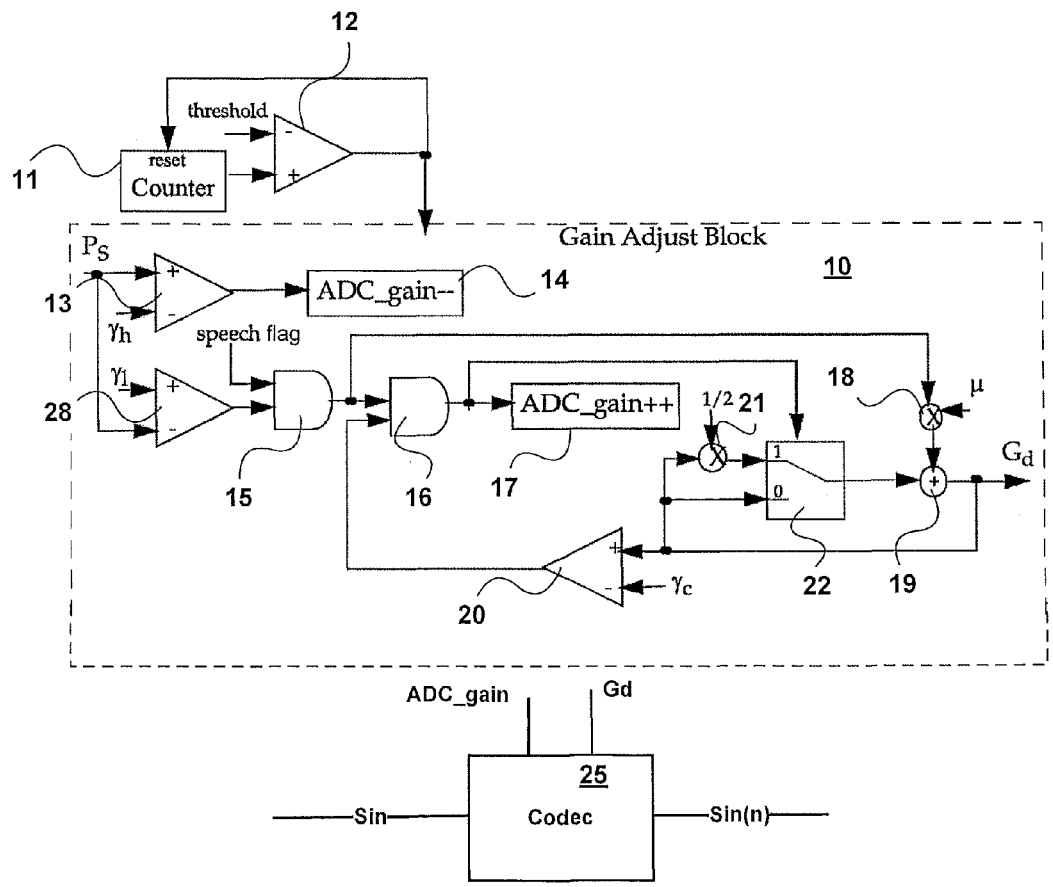
FIG. 2 is a block diagram of an automatic gain control circuit in accordance with an embodiment of the invention.

The automatic gain control circuit shown in FIG. 2 is suitable for use with a microphone for a mobile telephone. In this embodiment, the microphone gain control is separated into two parts: the analog gain ADC_gain and the digital gain Gd. Commercially available codecs, such as the MT8960 sold by Zarlink Semiconductor Inc. allow for both analog and digital gain control. The analog gain control acts on the input signal prior to analog to digital conversion, and the digital gain control acts on the digital samples of the input signal.

The codec analog gain normally has a larger step size than the digital gain. A 6 dB step is very common for analog gain. In order to control the variation of the gain slowly, the digital gain is changed. The overall gain applied to the input signal is a combination of these two gains.

As shown in FIG. 2, the gain adjust block 10 for a codec 25 converting the analog signal Sin to a digital signal Sin(n) is controlled by a counter 11 which supplies a comparator 12. When the counter reaches a certain value, determined by the threshold value applied to an input of the comparator, it starts the microphone gain adjustment process and in the meantime, resets its content to zero. The purpose of the counter is to provide sufficient time for the signal power ($P_s$) to update its value after each gain adjustment.

The gain adjustment block 10 comprises a first comparator 13 connected to a block 14 for reducing the analog gain and a second comparator 28 connected through AND gates 15 and 16 to a block 16 for increasing the analog gain. The first AND gate 15 has one input receiving a speech flag generated by a speech detector (not shown).

When the gain adjustment block first starts, it compares the signal power Ps of the input signal with a high threshold value γh. If the signal power from microphone is above the high threshold γh, the microphone is saturated and the block 14 is activated to reduce the analog gain of the codec by one step (normally 6 dB).

The signal power PS is also compared with a low threshold γl. If the signal power is above the threshold, the comparator 28 does not present an output and nothing changes. If the signal power is below the low threshold γl and speech is present, it means that signal power is too low. In this case a small gain step μ is added by the multiplier 18 to the digital gain signal Gd, which controls the digital gain of the codec.

The detection of speech activity is important to make sure that the gain will not be increased in the presence pure noise. When speech is not present, a low noise power should not trigger the digital gain increase because the comparator 15 will not generated an output.

The two threshold γl and γh should not be the same and there will be noticeable difference between them (γh>γl). γh is the saturation threshold and γl should be well below γh for two reasons because the microphone should not always work around saturation level. It is necessary to maintain a certain dynamic range for the peak signal power. Also, it is very important to maintain a stable microphone gain for both good echo cancellation and high speech quality.

A stable microphone gain is maintained when signal power ranges between γh and γl. This signal power range is called the Dead-Zone because in the DeadZone, the microphone gain will not be adjusted.

Ideally, the ADC analog gain should be maintained to maintain the maximum dynamic range for the codec. As noted above digital gain is used to increase the gain slowly because the analog gain normally has a large step size. Therefore, when the digital gain is above certain value $γ_c$, the analog gain can be increased by 6 dB and the digital gain reduced at the same time by 6 dB, which means that the gain is divided by 2, so that the total gain remains the same. This is achieved by comparator 20, divider 21 and Mux 22. When the digital gain Gd exceeds the threshold $γ_c$, and an output signal is present from the comparator 15, the comparator 16 selects the input 1 of the Mux 22 to divide the digital gain signal by a factor of 2. At the same time the output of the comparator 16 activates the block 17 to increase the analog gain by 6 db, resulting in a net gain change of zero.

Figure 3:
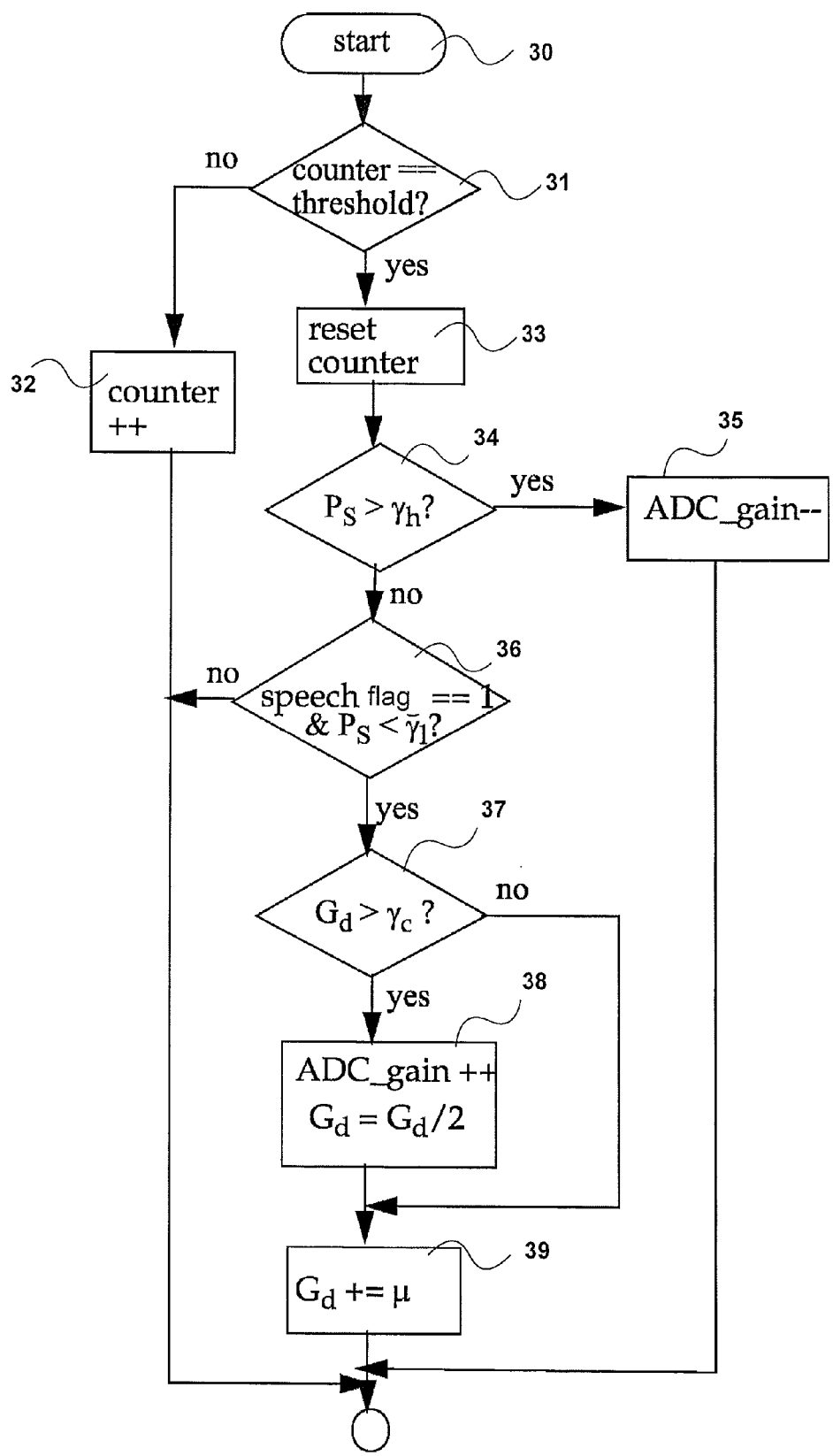
FIG. 3 is a flow chart illustrating the operation of an automatic gain control circuit in accordance with an embodiment of the invention.

A flow chart illustrating the operation of the automatic microphone gain control circuit is shown in FIG. 3. The system starts at step 30. The contents of the counter 111 are compared with the counter threshold in step 31. If the count does not equal the threshold, the counter is incremented at step 32 and the system loops back to the start 30. If the count equals the threshold, the counter is reset at step 33 and at step 34 a determination made as to whether Ps>γh. If yes, the analog gain is decremented by one increment at step 35. If not, at step 36 a determination is made as to whether speech is present and Ps<γl. If no, the system loops back to the start. If yes, at step a determination is made at step 37 as to whether Gd>γc. If not, the digital gain Gd is incremented by a factor μ at step 39 and the system loops back to the start. If not, at step 38, the analog gain is incremented by one increment of 6 dB, and the digital gain divider is activated so that the digital gain is divided by 2, which has the effect of reducing the digital gain generated by the circuit by 6 dB. The overall gain thus remains the same.

The actual parameters used in the mobile acoustic echo canceller depend on the particular application and will be selected by a person skilled in the art. γh is the signal saturation level, and its value depends on the particular codec being used. Codec dynamic range and linearity range determine its value. Normally, this level is around 0 dBm0 to 9 dBm0 for voice applications.

γl is the minimum signal level sent from codec for acoustic echo cancellation. For better echo cancellation performance, this level should be increased to give a better dynamic range. However, to stabilize microphone gain for both speech quality and echo cancellation, it is important to maintain a sufficiently large dead-zone, In general γl should at least 6 dB below γh. Typically, γl should chosen 6-12 dB below γh.

The value of the counter threshold depends on how many data frames are needed for the signal power update. For speech applications, this value can be chosen around 16000 for an 8 KHz sampling frequency.

$γ_c$ is the maximum digital gain which can be applied to the codec input signal. To get a large signal dynamic range, it is preferable to use as much analog gain as possible. In general, $γ_c$ should be given the value 1. In such a case, Gd varies between 0.5 and 1.

The ADC_gain step size is typically 6 dB.

The value of μ should be small for slow gain variation. It makes echo cancellation more stable. However, if μ is too small, the microphone may stay in the low gain for too long and far-end listener may complain that the speech volume is too small. A suitable value for μ is 0.01, although for different applications, much more variation on μ is always possible.

Figure 4:
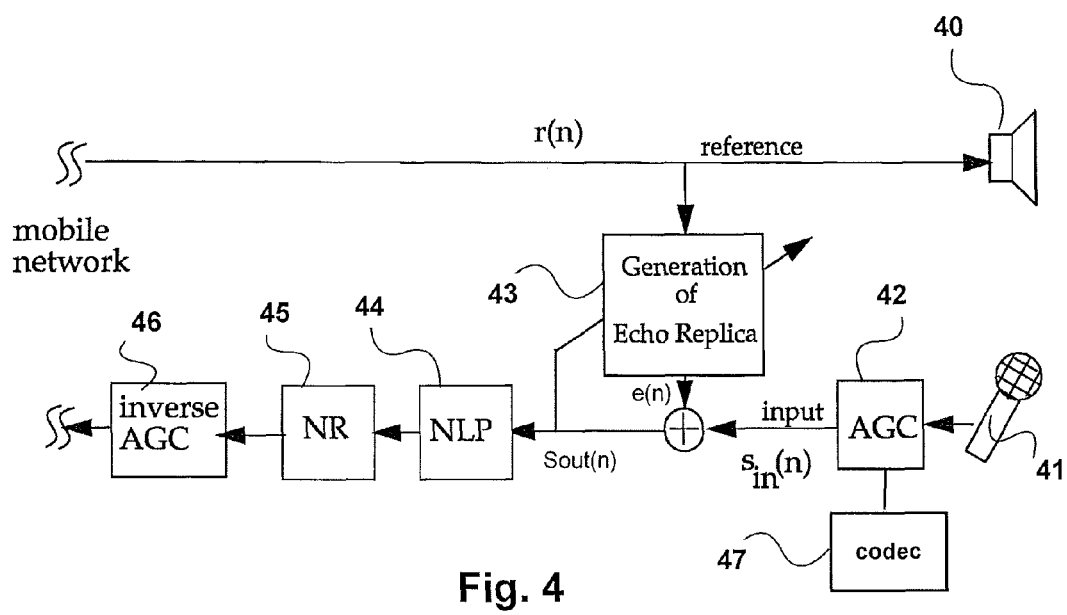
FIG. 4 is a block diagram of a mobile handsfree echo cancellation and noise control circuit.

FIG. 4 shows a complete mobile handsfree echo cancellation and noise control system. Reference signal r(n) received from the mobile network is passed to loudspeaker 40, which generates an echo through microphone 41. Automatic gain control circuit 42, associated with codec 47, controls the gain of the microphone signal Sin(n). The echo is cancelled by echo canceler 43 to produce Sout(n), which is passed to non-linear processor 44 and noise reduction circuit 45 in a manner that is conventional per ser. In the mobile handsfree applications, a sudden increase in background noise is the normal cause of microphone saturation, such as window open while driving on the highway. When the microphone is saturated, the automatic gain control circuit 42 will reduce the analog gain.

When the noise condition improves, the automatic gain control circuit should release the gain reduction (that is increase gain) slowly. If the gain is increased too fast, it will cause both unstable echo cancellation and variation in speech level. If the gain is released too slowly, the far-end listener may experience too low a speech level for a long time.

To overcome this problem, an inverse AGC function 46 is added in FIG. 4. This inverse AGC reverses all AGC gain reduction with a gain increase, maintaining the total gain from microphone to mobile network unchanged. The inverse AGC 46 can operate in the same ways as the AGC 42, expect that the signals are reversed so that when the AGC 42 increments, the AGC 46 decrements by the same amount and vice versa. The signal to the mobile network may not be saturated even with this inverse AGC because echo component at microphone is cancelled by echo cancellation and non-linear processor (NLP), and the wind-noise is reduced by noise reduction (NR) circuitry before the inverse AGC. The scheme in FIG. 4 can maintain speech level unchanged while controlling the microphone saturation.

The invention claimed is:

1. An automatic gain control unit for controlling the gain applied to an input signal produced by a microphone subject to ambient noise, wherein said input signal is passed through a codec having analog and digital gain control inputs for varying the analog and digital gain respectively each in increments of a first size and a second size, said second size being smaller than said first size, and said input signal having a signal level, said automatic gain control unit continually monitoring the signal level of said input signal, and comprising:
   a first comparator for determining when the input signal level exceeds a high threshold;
   a second comparator for determining when the input signal level falls below a low threshold;
   a third comparator for determining when said the digital gain exceeds a set threshold;
   a first gain controller for generating a first control signal to vary the analog gain of the codec in increments of said first size;
   a second gain controller for generating a second control signal to vary the digital gain of the codec in increments of said second size;
   wherein said first gain controller is configured to decrease the analog gain of the codec in response to said first comparator determining that said input signal level exceeds said high threshold, and
   wherein in response to the input signal level falling below said low threshold in the presence of a speech signal said second gain controller is configured to increase the digital gain of said codec, and
   wherein in response to the input signal level falling below said low threshold in the presence of a speech signal and the digital gain being above said set threshold, said first and second gain controllers are configured to increase the analog gain and decrease the digital gain of the codec such that the increase in analog gain compensates fir the decrease in digital gain.

2. An automatic gain control unit as claimed in claim 1, wherein in response to said second comparator determining that said digital gain falls below set threshold, the analog gain is increased by an amount equal to the reduction in digital gain so that the overall gain remains the same.

3. An automatic gain control unit as claimed in claim 1, further comprising a multiplexer having an input connected to a divider for reducing the digital gain by preset factor and selectable in response to a determination by said third comparator that said digital gain exceeds said set threshold and a determination by said second comparator that said input signal has a level below said low threshold.

4. An automatic gain control unit as claimed in claim 1, wherein said increment of said first size is 6 dB.

5. An automatic gain control unit as claimed in claim 1, further comprising a timing arrangement for periodically triggering said automatic gain control circuit.

6. An automatic gain control unit as claimed in claim 5, wherein said timing arrangement comprises a counter and threshold detector, and wherein said automatic gain control circuit is triggered in response to said counter reaching a predetermined count threshold.

7. An automatic gain control unit as claimed in claim 1, further comprising an inverse gain control circuit for canceling out the gain applied to said input signal by said first and second gain control circuits after echo and noise suppression.

8. A microphone system for use in a mobile telephone, comprising:
   a first automatic gain control unit comprising:
   a first comparator for determining when an input signal level exceeds a high threshold;
   a second comparator for determining when said input signal level falls below a low threshold;
   a third comparator for determining when said the digital gain exceeds a set threshold;
   a first gain controller for generating a first control signal to vary the analog gain of the codec in increments of said first size:
   a second gain controller for generating a control signal to vary the digital gain of the code in increments of said second size, said second size being smaller than said first size; and
   wherein said first gain controller is configured to decrease the analog gain of the codec in response to said first comparator determining that said input signal level exceeds said high threshold,
   wherein in response to the input signal level falling below said low threshold in the presence of a speech signal said second gain controller is configured to increase the digital gain of said codec, and
   wherein in response to the input signal level below said low threshold in the presence of a speech signal and the digital gain being above said set threshold, said first and second controllers are configured to increase the analog gain and decrease the digital gain of the codec such that the increase in analog gain compensates for the decrease in digital gain;
   an echo canceller and noise reduction circuitry for canceling echo and reducing noise in the signal output by the first automatic gain control unit; and
   an inverse gain control unit for canceling out the gain applied by said first automatic gain control unit after echo cancellation and noise reduction.

9. A method of controlling the gain applied to an input signal produced by a microphone subject to ambient noise, wherein the input signal is passed to a codec having an analog gain control and a digital gain control comprising:
   continually monitoring the input signal;
   decreasing the gain applied to said input signal in increments of a first size when said input signal exceeds a high threshold; and
   when said input signal falls below a low threshold in the presence of a speech-present signal increasing the gain applied to said input signal in increments of a second size being less than said first size, and if the digital gain exceeds said set threshold increasing the analog gain and decreasing the digital gain to compensate for the increased analog gain.

10. A method as claimed in claim 9, wherein the increase in analog gain resulting from the digital gain exceeding said third threshold matches the reduction in digital gain so that the overall gain remains the same.

11. A method as claimed in claim 9, wherein a counter counts up to a predetermined threshold, and periodically triggers the monitoring of said signal when the counter reaches the predetermined threshold.

* * * * *